United States Patent
Kimura

(10) Patent No.: US 8,236,620 B2
(45) Date of Patent: Aug. 7, 2012

(54) METHOD OF MANUFACTURING A SEMICONDUCTOR DEVICE

(75) Inventor: Naoto Kimura, Fukuoka (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/081,174

(22) Filed: Apr. 6, 2011

(65) Prior Publication Data

US 2011/0183473 A1 Jul. 28, 2011

Related U.S. Application Data

(62) Division of application No. 12/048,447, filed on Mar. 14, 2008, now Pat. No. 7,944,027.

(30) Foreign Application Priority Data

Mar. 14, 2007 (JP) .................................. 2007-065277

(51) Int. Cl.
*H01L 21/60* (2006.01)
(52) U.S. Cl. ................. 438/123; 257/666; 257/E21.506
(58) Field of Classification Search .................. 257/666, 257/674, 692; 438/123
See application file for complete search history.

(56) References Cited

U.S. PATENT DOCUMENTS

| 7,176,557 | B2 | 2/2007 | Shimanuki et al. |
| 7,339,261 | B2 | 3/2008 | Shimanuki et al. |
| 2002/0167074 | A1 | 11/2002 | Kim |
| 2003/0030131 | A1* | 2/2003 | Lee et al. ...................... 257/666 |
| 2005/0212116 | A1 | 9/2005 | Shimanuki et al. |
| 2007/0108563 | A1 | 5/2007 | Shimanuki et al. |

FOREIGN PATENT DOCUMENTS

| JP | 8153845 | 6/1996 |
| JP | 10-209194 | 8/1998 |
| JP | 2005276890 | 10/2005 |

OTHER PUBLICATIONS

JP Office Action dated Jun. 28, 2011, with English translation.

* cited by examiner

*Primary Examiner* — Jarrett Stark
*Assistant Examiner* — Lawrence Tynes, Jr.
(74) *Attorney, Agent, or Firm* — Young & Thompson

(57) ABSTRACT

To solve a problem in that a die processing cost increases when employing a method involving providing a suction hole in the die to fix an island onto a bottom surface, provided is a semiconductor device, which includes: a semiconductor chip, an island having a first surface, on which the semiconductor chip is mounted, and a second surface opposing to the first surface, a hanger pin extended from the island, a branch portion extended from one of the island and the hanger pin, and a resin encapsulating the semiconductor chip, the island, the hanger pin and the brunch portion while exposing the second surface of the island.

20 Claims, 9 Drawing Sheets

PRIOR ART

METHOD OF MANUFACTURING A SEMICONDUCTOR DEVICE

BACKGROUND OF THE INVENTION

1. Field of the Invention

The present invention relates to a lead frame, a semiconductor device, and a method of manufacturing the semiconductor device.

2. Description of the Related Art

FIG. 7 is a cross-sectional view illustrating a manufacturing method for a related art semiconductor device. FIG. 7 shows a state in which resin encapsulation is performed while a lead frame 104 mounted with a semiconductor chip 102 is disposed in a die 106. The lead frame 104 includes an island 108, hanger pins 110, and lead terminals 112. The lead terminals 112 are electrically connected with a semiconductor chip 102 by wire bonding. Further, in order to obtain a semiconductor device having a structure in which the island 108 having a function serving as a radiation plate is exposed to a sealing resin, a lead frame 104 is disposed so that a lower surface of the island 108 is brought into contact with a bottom surface of the die 106.

However, as shown in FIG. 7, there may occur a case where the island 108 is inclined due to a force of flow when the sealing resin is injected into the die 106. Then, as shown in FIG. 8, the resin enters below the island 108 to produce an unfavorable resin burr 114 on the lower surface of the island 108. As a result, only a part of the lower surface of the island 108 can be exposed to the surface of the sealing resin 116. FIG. 8 is a plan view showing a back surface of a semiconductor device after the fabrication thereof. Heat conductivity of the resin burr 114 is lower than that of the island 108 formed of steel, etc. For that reason, a heat radiation effect becomes lower, resulting in raising an operation temperature of the semiconductor chip 102. This causes a malfunction or a failure of the semiconductor chip 102.

FIG. 9 is a cross-sectional view illustrating a method of manufacturing a semiconductor device disclosed in Japanese Patent Application Laid-Open No. Hei 10-209194. In FIG. 9 a lead frame 206 including an island 202 and lead terminals 204 is disposed in a die 208. Mounted on the island 202 is a semiconductor chip 210. The semiconductor chip 210 is electrically connected to the lead terminals 204 by wire bonding. The die 208 has a suction hole 212 formed at a portion contacting the island 202. Using a suction force through the suction hole 212, the island 202 is fixed to a bottom surface of the die 208.

However, in the manufacturing method disclosed in Japanese Patent Application Laid-Open No. Hei 10-209194, formation of the suction hole in the die is required, resulting in increasing processing cost for the die.

SUMMARY

A lead frame of the present invention includes: an island having a first surface with an area for semiconductor chip, and a second surface opposing to the first surface, a hanger pin extended from the island; and a branch portion inclined towards a side of the second surface of the island.

The lead frame has the branch portions branched from the hanger pins. The branch portions function as levers when the lead frame is disposed in the die. In other words, imparting a force that causes the branch portions inclined towards the second surface side of the island to return to a level, a force acts on the island to press the island to the bottom of the die by the action of a lever. With this force, it is possible to suppress the generation of the resin burr at the time of resin encapsulation without using any special die.

Further, a semiconductor device of the present invention includes: a semiconductor chip, an island having a first surface, on which the semiconductor chip is mounted, and a second surface opposing to the first surface, a hanger pin extended from the island, a branch portion extended from one of the island and the hanger pin, and a resin encapsulating the semiconductor chip, island, the hanger pin and the brunch portion while exposing the second surface of the island.

The above-mentioned semiconductor device is manufactured using the lead frame having the branch portions. With this, generation of the resin burr at the time of resin encapsulation can be suppressed without using any special die.

Further, a method of manufacturing a semiconductor device according to the present invention includes: preparing a lead frame, which includes a island having a first surface with an area for semiconductor chip, and a second surface opposing to the first surface; mounting the semiconductor chip on the first surface of the island; disposing the lead frame in a die including an upper die and a lower die such that the branch portion is sandwiched between the upper die and the lower die; and injecting a resin into the die to mold the semiconductor chip in the die.

In the above-mentioned method, the lead frame having the branch portions is used. With this, generation of the resin burr at the time of resin encapsulation can be suppressed without using any special die.

According to the present invention, there can be realized the lead frame, the semiconductor device, and the method of manufacturing the semiconductor device, with which it is possible to suppress the generation of the resin burr at the time of resin encapsulation.

BRIEF DESCRIPTION OF THE DRAWINGS

The above-mentioned and other objects, features and advantages of the present invention will become more apparent with reference to the following detailed description of the invention taken in conjunction with the accompanying drawings, in which.

DETAILED DESCRIPTION OF THE PREFERRED EMBODIMENTS

Figure 1:
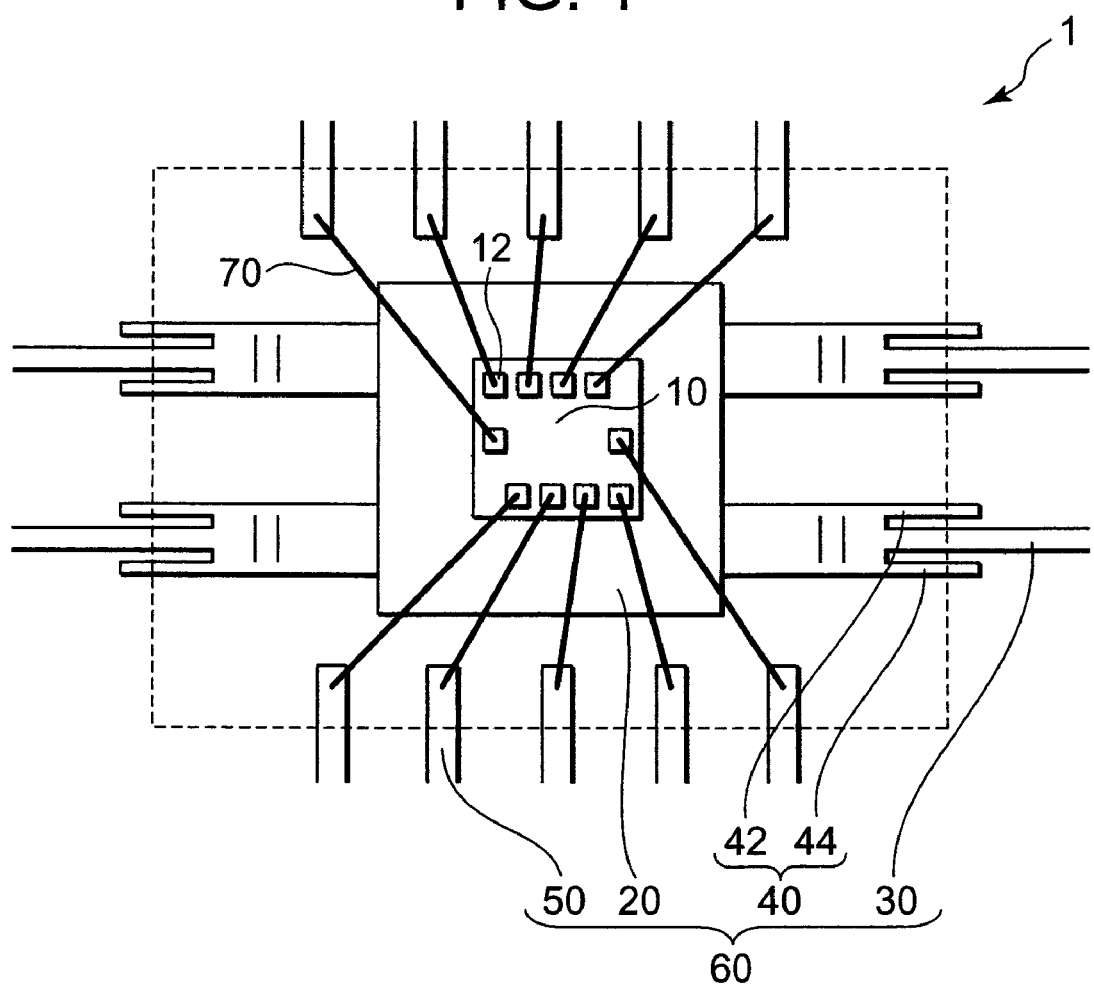
FIG. 1 is a plan view illustrating a semiconductor device according to an embodiment of the present invention.

Now a description will be made of a preferred embodiment of the present invention with reference to the drawings. In the description of the drawings, the like reference numeral denotes the same or equivalent component, and the duplicate description thereof is omitted.

Figure 2:
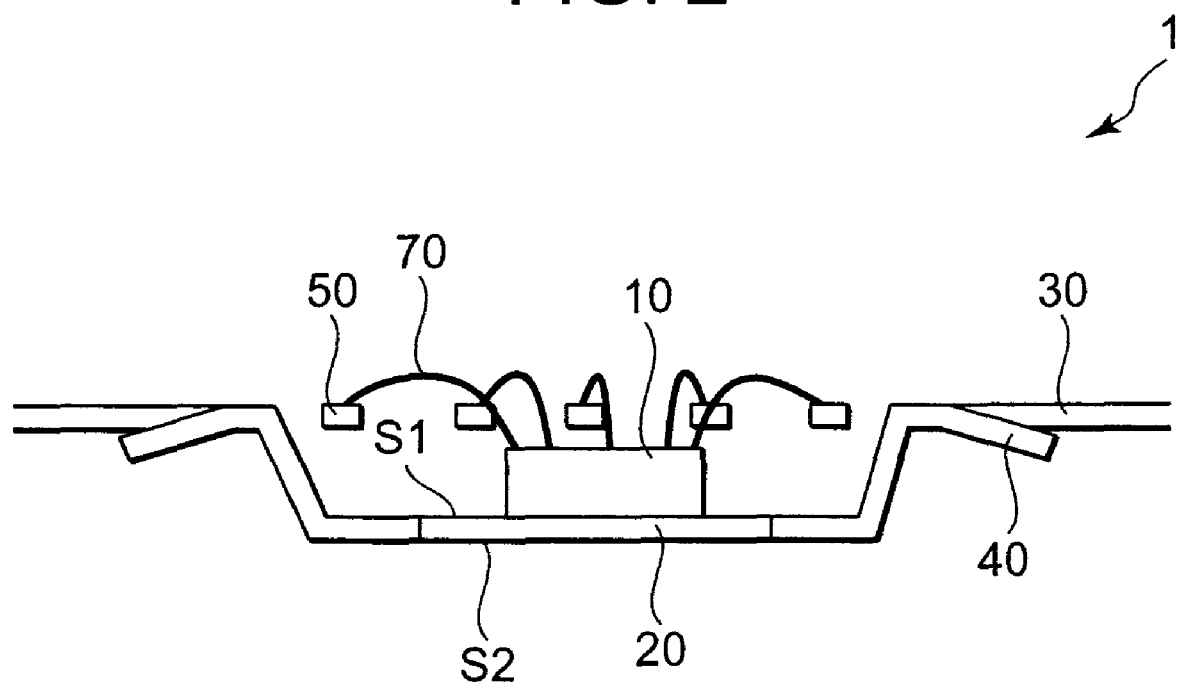
FIG. 2 is a cross-sectional view illustrating a semiconductor device according to the embodiment of the present invention.

FIGS. 1 and 2 are each a plan view and a cross-sectional view for illustrating a semiconductor device according to an embodiment of the present invention. A semiconductor device 1 includes a semiconductor chip 10; an island 20 including an upper surface S1 (first surface) on which the semiconductor chip (10) is mounted, and a lower surface S2 (second surface) being an opposite surface to the first surface (S1); hanger pins (30) coupled to the island (20), for holding the island (20); and branch portions (40) branched from the hanger pins (30). As the semiconductor device 1, there are exemplified Quad Flat Package (QFP) and Small Outline Package (SOP), for instance.

The semiconductor chip 10 is electrically connected to lead terminals 50 by wire bonding. Specifically, pads 12 of the semiconductor chip 10 are connected to the lead terminals 50 via wires 70. An island 20, hanger pins 30, branch portions 40, and lead terminals 50 constitute a lead frame 60.

The branch portions 40 each include a branch portion 42 (a first branch portion) and a branch portion 44 (a second branch portion) formed on both sides of the respective hanger pins 30.

The branch portions 40 are processed so as to bend towards a lower surface S2 side of the island 20, with the result that the branch portions 40 are inclined towards the lower surface S2 side (refer to FIG. 2). Further, the lower surface S2 is set to downside, the island 20 exists at a lower position than the branch portions 40 of the hanger pins 30.

Figure 3:
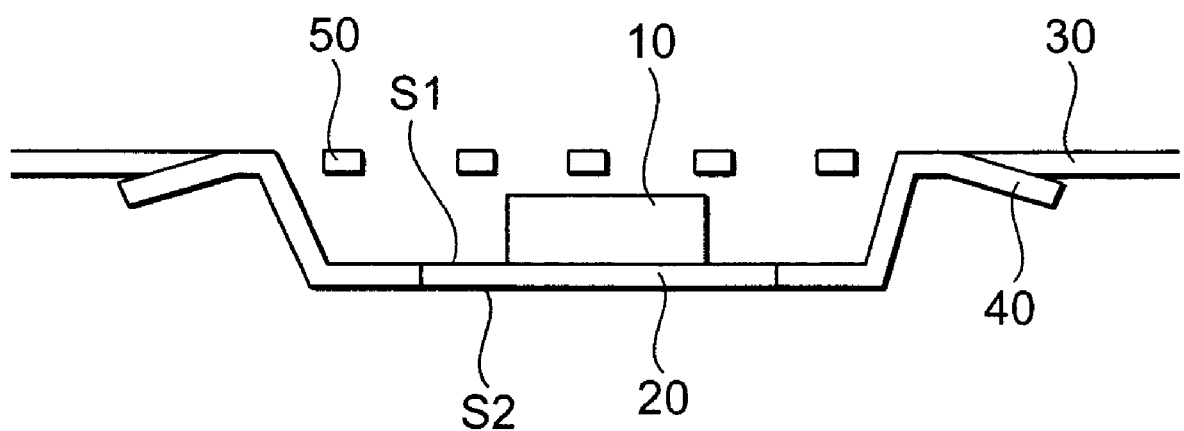
FIG. 3 is a process view illustrating a manufacturing method for a semiconductor device according to an embodiment of the present invention.
Figure 4:
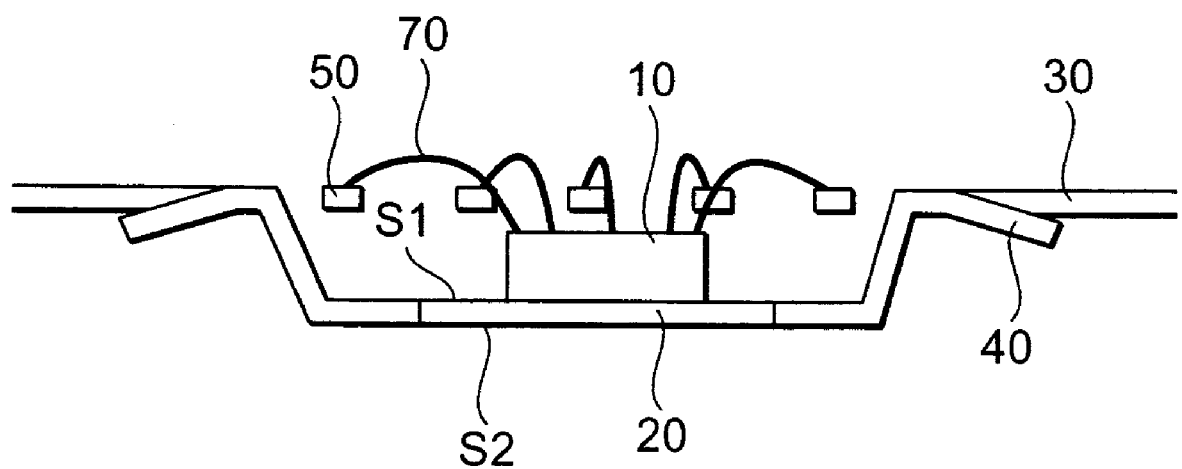
FIG. 4 is a process view illustrating a manufacturing method for a semiconductor device according to an embodiment of the present invention.

Referring to FIGS. 3 to 6, a description is made of a method of manufacturing a semiconductor device of the present invention. First, the above-mentioned lead frame 60 is prepared. After that, the semiconductor chip 10 is mounted on the upper surface S1 of the island (FIG. 3). The bonding of the semiconductor chip 10 may be performed, for example, at a center of the island 20 by using an adhesive. Then, the semiconductor chip 10 is electrically connected to the lead terminals 50 via wires 70 (FIG. 4).

Figure 5:
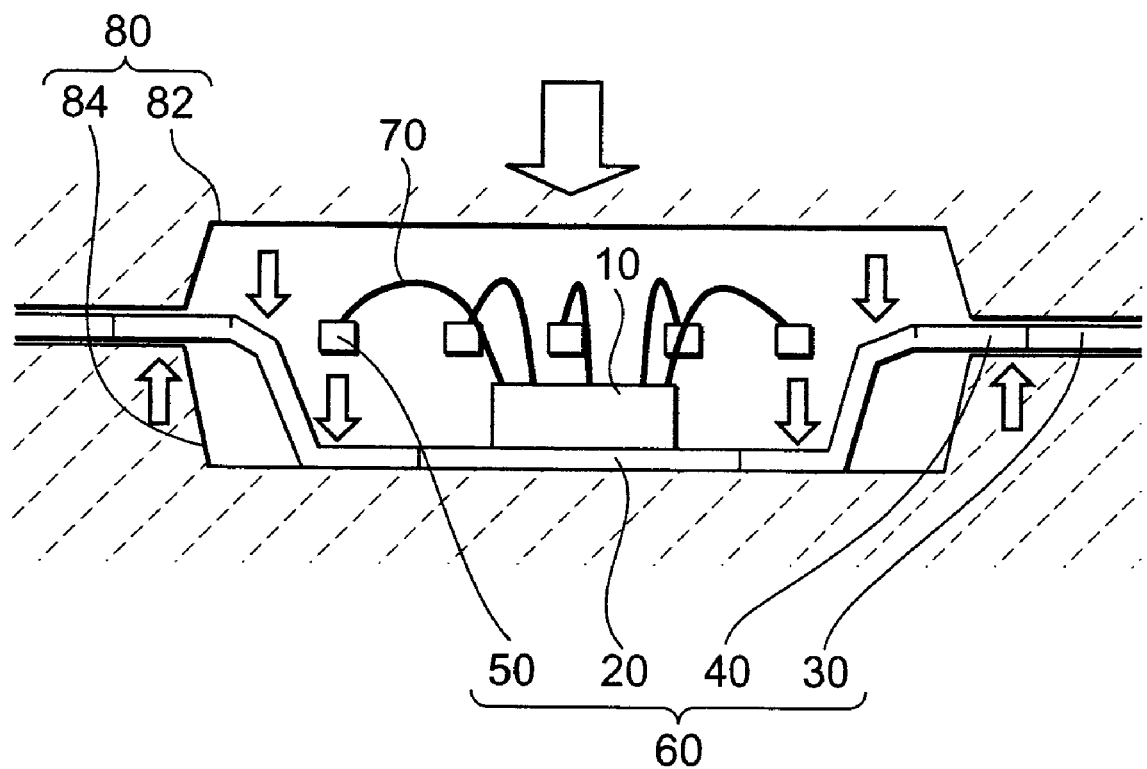
FIG. 5 is a process view illustrating a manufacturing method for a semiconductor device according to the embodiment of the present invention.

Next, the lead frame 60 is disposed in a die 80 including an upper die 82 and a lower die 84 (FIG. 5). In this case, the lead frame 60 is disposed in the die 80 so that the branch portions 40 are sandwiched by the upper die 82 and the lower die 84. Specifically, after the disposition of the lead frame 60 in the fixed lower die 84, the upper die 82 is lowered, to thereby cramp the hanger pins 30 and the branch portions 40. Further, the lead frame 60 is disposed in the die 80 so that the lower surface S2 of the island 20 is brought into contact with the bottom surface of the lower die 84.

Figure 6:
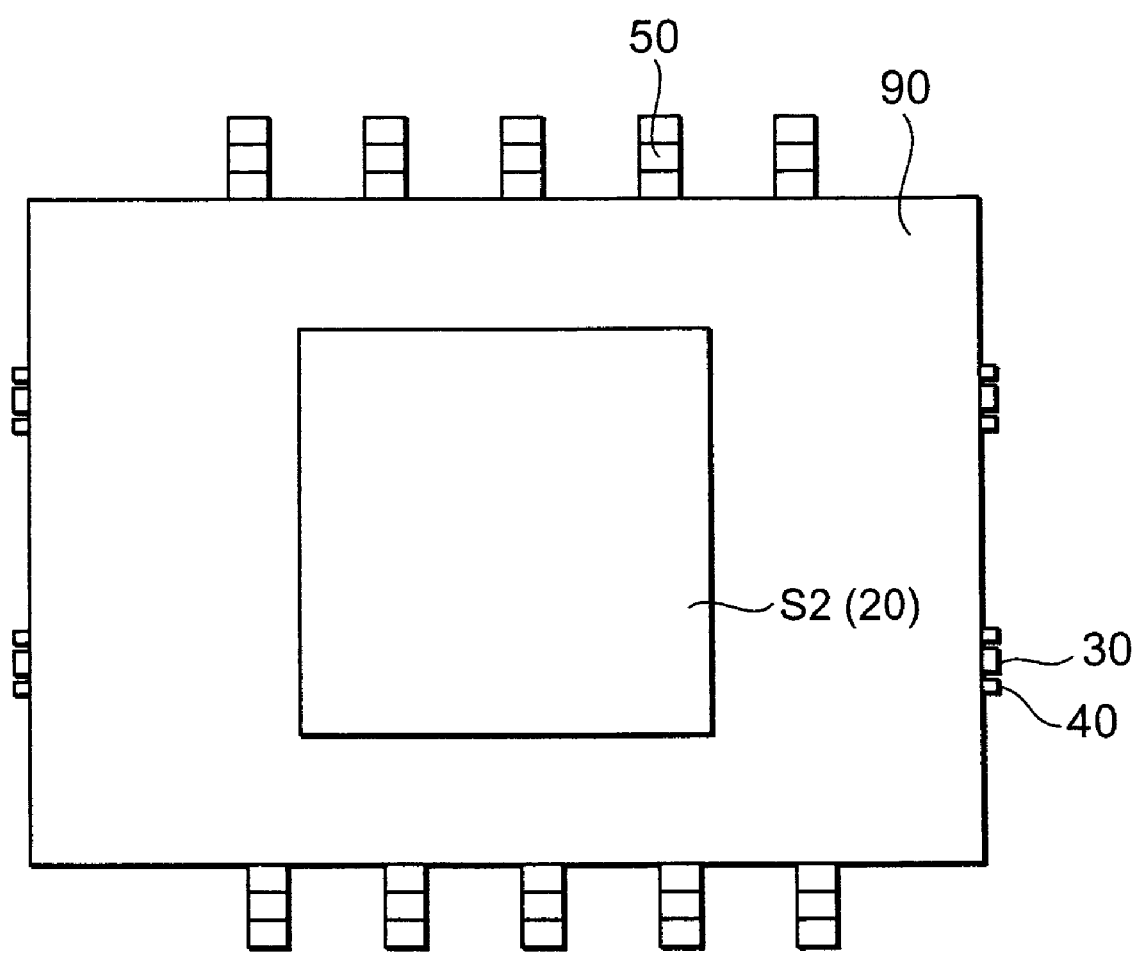
FIG. 6 is a process view illustrating a manufacturing method for a semiconductor device according to the embodiment of the present invention.
Figure 7:
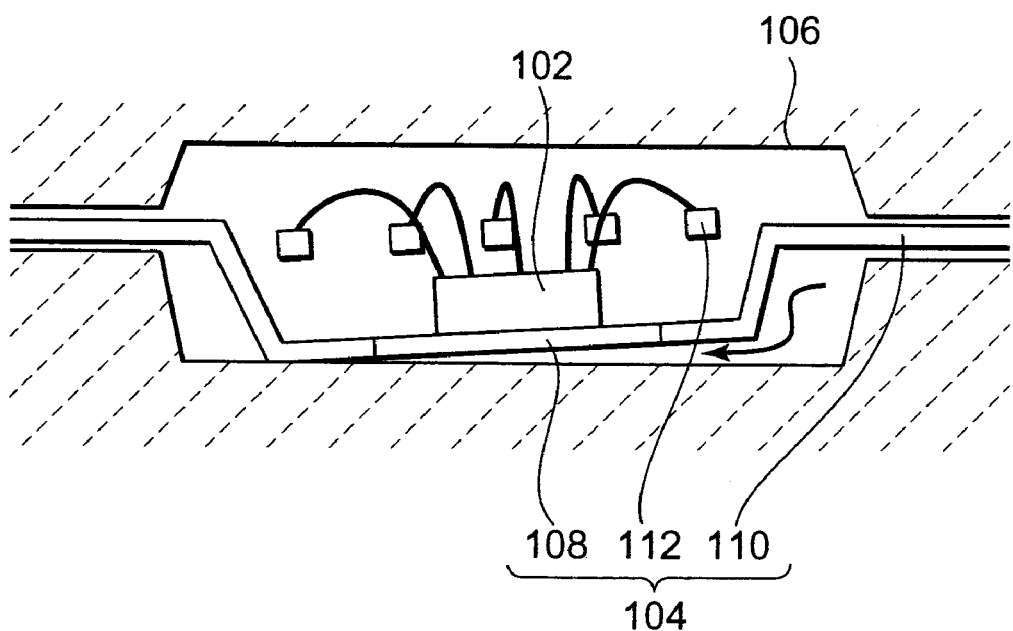
FIG. 7 is a cross-sectional view illustrating a related art manufacturing method for a semiconductor device.
Figure 8:
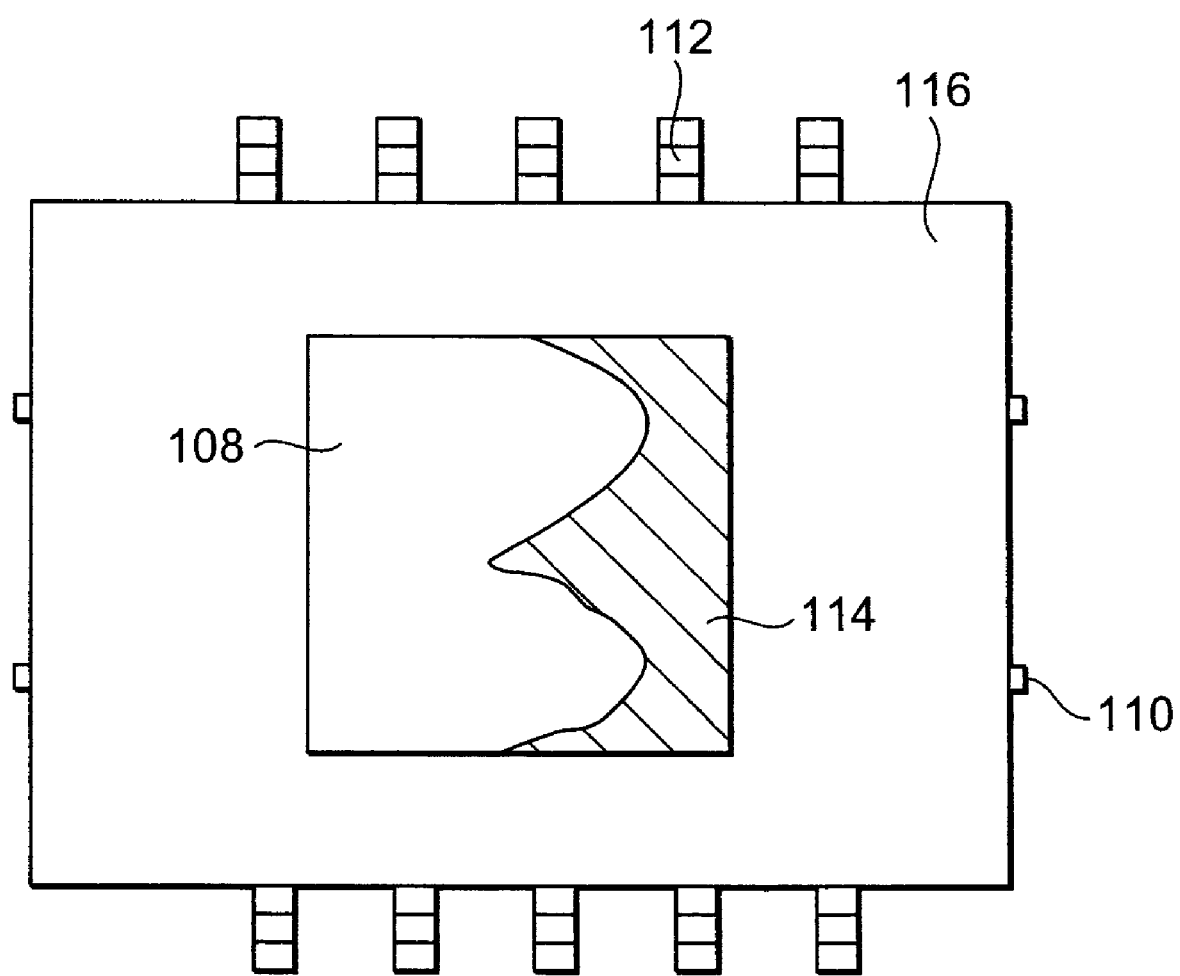
FIG. 8 is a plan view for explaining a problem of a related art manufacturing method for a semiconductor device.

Subsequently, a sealing resin such as an epoxy resin is injected in the die 80 under a state in which the lead frame 60 is disposed in the die 80. With this, the semiconductor chip 10 is covered with the sealing resin. After that, the hanger pins 30 and the branch portions 40 are cut so that portions bled out from the sealing resin may be cut. Further, the lead terminals 50 is shaped into a predetermined shape. With the above-mentioned processes, the semiconductor device of FIG. 6 can be obtained. FIG. 6 is a plan view illustrating a back surface of the semiconductor device. The lower surface S2 of the island 20 is exposed to a surface of a sealing resin 90.

Effects of the embodiment of the present invention are described. In this embodiment, the branch portions 40 branched from the hanger pins 30 are provided. The branch portions 40 function as levers at the time when the lead frame 60 is disposed in the die 80. In other words, the branch portions 40 are sandwiched by the upper die 82 and the lower die 84, and accordingly a force is imparted so as to return the branch portions 40 inclined towards the lower surface S2 side of the island 20 to a level. As a result, due to a principal of a lever, a force acts on the island 20 to press the island 20 against the bottom surface of the die 80 (refer to FIG. 5).

With this, the sealing resin can be injected under a state in which there is no gap between the island 20 and the lower die 84. Owing to this, it is possible to suppress the generation of resin burr at the time of resin encapsulation without using any special die. As a result, the generation of the resin burr can be suppressed without causing an increase in processing costs for the die. As described above, if the generation of the resin burr is suppressed, an exposure area of the lower surface S2 of the island 20 increases, thereby being capable of efficiently radiating heat generated at the semiconductor chip 10 through the island 20.

Figure 9:
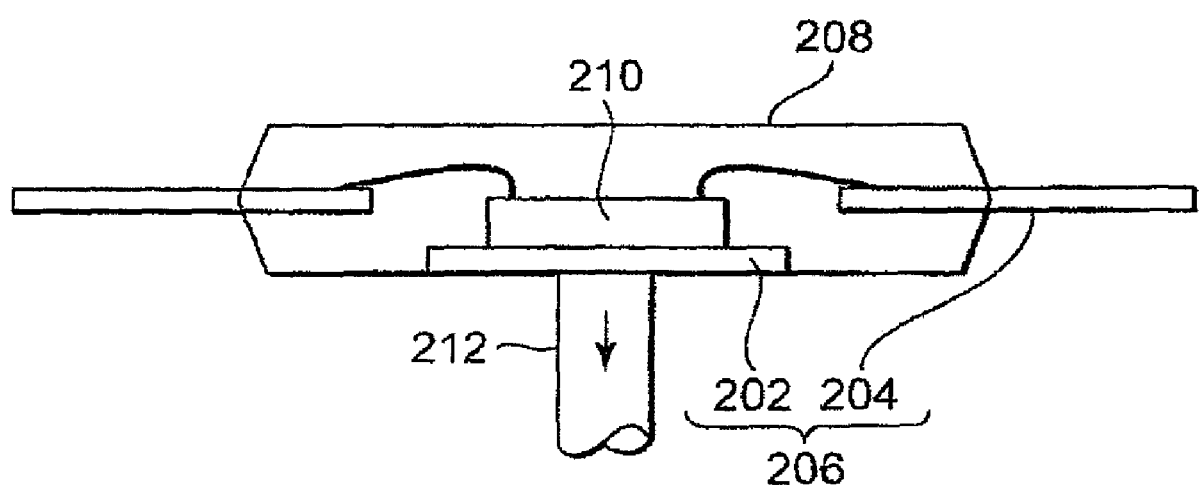
FIG. 9 is a cross-sectional view for explaining a related art manufacturing method for a semiconductor device.

By the way, the related art shown in FIG. 9 has the following three problems other than a problem of being high in cost for processing the die. First, there is a problem in that the die temperature becomes unstable and a resin temperature varies due to the suction, thereby being difficult to perform the resin encapsulation in a good manner. Secondly, if the resin enters at the time of suction, the suction hole is buried to cause a die failure, which is a problem of generating a repair cost. Third problem lies in that the suction is performed to the center of the island, there may have a higher risk of occurrence of rises of peripherals of the island, so the resin burr is liable to occur. According to this embodiment, those problems can be eliminated.

What is claimed is:

1. A method of manufacturing a semiconductor device, comprising:
   preparing a lead frame, which includes a island having a first surface with an area for semiconductor chip, and a second surface opposing to the first surface;
   mounting the semiconductor chip on the first surface of the island;
   disposing the lead frame in a die including an upper die and a lower die such that the branch portion is sandwiched between the upper die and the lower die; and
   injecting a resin into the die to mold the semiconductor chip in the die,
   wherein the lead frame includes a hanger pin extending from the island along a first direction, and a branch portion branching from the hangar pin and extending along opposing sides of the hanger pin along the first direction, and
   the branch portion has a terminated portion and a bent portion on a side of the terminated portion, the branch portion between the terminated portion and the bent portion being inclined towards a side of the second surface of the island.

2. The method of manufacturing a semiconductor device according to claim 1, wherein the lead frame is disposed in the die so that the second surface of the island is brought into contact with a bottom surface of the lower die.

3. The method of manufacturing a semiconductor device according to claim 1, wherein the resin is an epoxy resin.

4. The method of manufacturing a semiconductor device according to claim 1, further comprising:
   cutting the hanger pin and the branch portion so that bleed out from the sealing resin may be cut.

5. The method of manufacturing a semiconductor device according to claim 1, wherein the branch portion functions as a lever when the lead frame is disposed in the die.

6. The method of manufacturing a semiconductor device according to claim 1, wherein a force acts on the island to press the island against a bottom surface of the die.

7. The method of manufacturing a semiconductor device according to claim 6, wherein there is no gap between the island and the lower die when injecting the resin.

8. The method of manufacturing a semiconductor device according to claim 7, wherein generation of resin burr is suppressed during injecting the resin without using a special die.

9. The method of manufacturing a semiconductor device according to claim 8, wherein the suppressed generation of resin burr increases an exposure area of the second surface of the island, thereby being capable of efficiently radiating heat generated at the semiconductor chip through the island.

10. The method of manufacturing a semiconductor device according to claim 1, wherein the branch portion comprises a first branch portion and a second branch portion formed on both sides of the hanger pin.

11. The method of manufacturing a semiconductor device according to claim 10, wherein each branch portion comprises a first branch portion and a second branch portion formed on both sides of the respective hanger pin.

12. A method of manufacturing a semiconductor device, comprising:
    preparing a lead frame, which includes a island having a first surface with an area for semiconductor chip, and a second surface opposing to the first surface, the lead frame including a plurality of hanger pins, each hanger pin having a branch portion branching from the hanger pin, each branch portion having a terminated portion and a bent portion on a side of the terminated portion, the branch portion between the terminated portion and the bent portion being inclined towards a side of the second surface of the island;
    mounting the semiconductor chip on the first surface of the island;
    disposing the lead frame in a die including an upper die and a lower die such that the branch portion is sandwiched between the upper die and the lower die; and
    injecting a resin into the die to mold the semiconductor chip in the die.

13. The method of manufacturing a semiconductor device according to claim 12, wherein the lead frame is disposed in the die so that the second surface of the island is brought into contact with a bottom surface of the lower die.

14. The method of manufacturing a semiconductor device according to claim 12, wherein the resin is an epoxy resin.

15. The method of manufacturing a semiconductor device according to claim 12, further comprising:
    cutting the hanger pin and the branch portions so that bleed out from the sealing resin may be cut.

16. The method of manufacturing a semiconductor device according to claim 12, wherein the branch portions function as a lever when the lead frame is disposed in the die.

17. The method of manufacturing a semiconductor device according to claim 12, wherein a force acts on the island to press the island against a bottom surface of the die.

18. The method of manufacturing a semiconductor device according to claim 17, wherein there is no gap between the island and the lower die when injecting the resin.

19. The method of manufacturing a semiconductor device according to claim 18, wherein generation of resin burr is suppressed during injecting the resin without using any special die.

20. The method of manufacturing a semiconductor device according to claim 19, wherein the suppressed generation of resin burr increases an exposure area of the second surface of the island, thereby being capable of efficiently radiating heat generated at the semiconductor chip through the island.

* * * * *